(12) United States Patent
Krier

(10) Patent No.: US 7,072,533 B1
(45) Date of Patent: Jul. 4, 2006

(54) AUTOMOTIVE OPTICAL TOUCH SENSITIVE SWITCH METHOD

(75) Inventor: James F. Krier, Grosse Pointe Woods, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 11/235,642

(22) Filed: Sep. 26, 2005

(51) Int. Cl.
*G02B 6/00* (2006.01)

(52) U.S. Cl. ............................ 385/13; 385/12; 385/16; 345/173; 362/488

(58) Field of Classification Search ................ 385/12, 385/13, 16–24, 30, 147; 345/173; 340/555–556, 340/854.7, 855.2; 362/488; 425/149
See application file for complete search history.

(56) References Cited

U.S. PATENT DOCUMENTS

| | | | |
|---|---|---|---|
| 5,822,099 A | 10/1998 | Takamatsu | |
| 5,994,840 A | 11/1999 | Forsdyke et al. | |
| 6,294,113 B1 * | 9/2001 | Woodmansee et al. | . 425/149 X |
| 6,478,565 B1 * | 11/2002 | Woodmansee et al. | ..... 425/149 |
| 6,535,694 B1 | 3/2003 | Engle et al. | |
| 6,633,694 B1 | 10/2003 | Tew | |
| 6,652,128 B1 * | 11/2003 | Misaras | ....................... 362/488 |
| 6,657,614 B1 | 12/2003 | Ito et al. | |
| 6,729,738 B1 | 5/2004 | Fuwausa et al. | |
| 6,743,988 B1 | 6/2004 | Bao et al. | |
| 6,810,163 B1 | 10/2004 | Saito | |
| 6,839,478 B1 | 1/2005 | Huber et al. | |
| 2002/0030668 A1 | 3/2002 | Hoshino et al. | |
| 2003/0090470 A1 | 5/2003 | Wolter et al. | |
| 2003/0202336 A1 | 10/2003 | Ostergard et al. | |
| 2004/0120684 A1 | 6/2004 | Ishibashi et al. | |
| 2004/0207605 A1 | 10/2004 | Mackey et al. | |
| 2004/0237669 A1 | 12/2004 | Hayward et al. | |
| 2004/0240777 A1 | 12/2004 | Woodgate et al. | |
| 2004/0251402 A1 | 12/2004 | Reime | |
| 2004/0252867 A1 | 12/2004 | Lan et al. | |
| 2005/0057523 A1 | 3/2005 | Moyer | |
| 2005/0063197 A1 | 3/2005 | Nightingale et al. | |
| 2005/0088417 A1 | 4/2005 | Mulligan | |
| 2005/0121602 A1 | 6/2005 | Peng et al. | |

* cited by examiner

*Primary Examiner*—Phan Palmer
(74) *Attorney, Agent, or Firm*—Brinks Hofer Gilson & Lione

(57) ABSTRACT

The optical control having an optical source that uses a transmission medium to deliver energy to an optical detector. Upon physical contact with the transmission medium changes in the internal reflection of the transmission medium occur and reduce the amount of energy being delivered to the detector. The change in internal reflection causes a change in the state of the optical control.

16 Claims, 3 Drawing Sheets

AUTOMOTIVE OPTICAL TOUCH SENSITIVE SWITCH METHOD

BACKGROUND

1. Field of the Invention

The present invention generally relates to an optical control for a human machine interface.

2. Description of Related Art

For automotive applications, as well as other environments, mechanical controls are typically used to provide input to an electrical system. Over time, the mechanical controls may wear or collect debris impeding the performance of the controls. Typically, these controls are moved, for example rotated or displaced, to provide user input to the system. Common controls could include knobs, levers, and switches. Recently, other sensing technologies have been investigated to replace controls that require mechanical movement. Some of the technologies investigated include resistive, capacitive, direct optical, and infrared, as well as microwave and magnetic inductance. Each of these approaches reveal a variety of feasibility issues. Although some of these technologies are currently available, their cost and form factor complicates designing them into the automotive interior environment efficiently. In addition, vehicle occupants should be able to identify the control at night in the dark. Accordingly, the control should be lit to help identify its location.

Automotive interiors pose many constraints that limit the use of the above mentioned technologies. Aesthetics, space, and cost concerns usually filter out the above mentioned choices. For example, touch panels typically use resistive technology, however, these devices are typically too large for automotive consoles and not compatible with the aesthetics of the automotive environment. Capacitive technologies are not compatible with vehicle occupants wearing gloves. Direct optical technologies are generally sensitive to varying day and night driving conditions. Infrared controls may be sensitive to vehicle occupants wearing gloves and have unacceptable response times. Other inductive techniques may lead to difficult packaging feasibility, as well as, electromagnetic noise issues.

In view of the above, it is apparent that there exists a need for an improved optical control for a human machine interface.

SUMMARY

In satisfying the above need, as well as overcoming the enumerated drawbacks and other limitations of the related art, the present invention provides an improved optical control for a human machine interface.

The optical control includes an optical source that uses a transmission medium to deliver energy to an optical detector. Changes in the internal reflection of the transmission medium will reduce the amount of energy being delivered to the detector. This change in internal reflection thus causes a change in the state of the optical control. The internal reflection through the transmission medium may be changed in many ways. However, a balance of input and output energy must be maintained such that the transmission, plus the reflection, plus the absorption must equal one. Therefore, if an item is introduced into contact with the transmission medium, increased absorption and scattering reflection outside the medium occurs. Accordingly, the transmission rate within the medium is reduced. Alternatively, if the geometry of the transmission medium is changed, the optical properties would be affected to achieve a similar result. Prior optical techniques, typically, used a direct source and a detector without utilizing changes in the total internal reflection of a medium between these devices. In addition, monitoring the internal reflection is less sensitive to ambient light since the ambient light can be decoupled from the source inputs based on transmission medium geometry.

Further objects, features and advantages of this invention will become readily apparent to persons skilled in the art after a review of the following description, with reference to the drawings and claims that are appended to and form a part of this specification.

DETAILED DESCRIPTION

Figure 1:
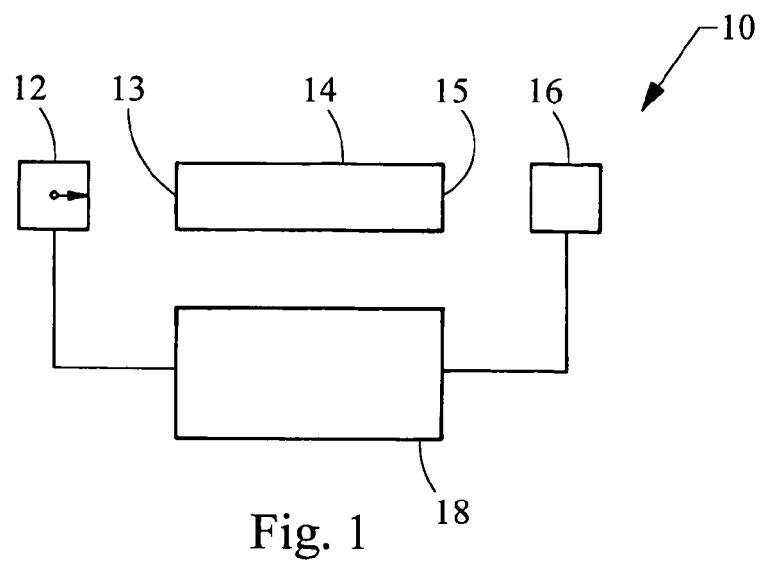
FIG. 1 is schematic view of an optical control in accordance with the present invention.

Referring now to FIG. 1, an optical control embodying the principles of the present invention is illustrated therein and designated at 10. As its primary components, the optical control 10 includes a light source 12, a transmission medium 14, and a detector 16. A control circuit 18 is in electrical communication with the optical source 12 to generate a beam of light. The beam of light is transmitted from the optical source 12 into the transmission medium 14, which is a medium such as a waveguide or translucent sheet allowing the beam of light to propagate therethrough. The beam of light enters at a first end 13 of the transmission medium 14 and exits at a second end 15, where an optical detector 16 is aligned with the second end 15 to receive the beam of light. The optical detector 16 generates an electrical signal based on the beam of light and the internal reflection characteristics of the transmission medium 14. This electrical signal is then provided to the control circuit 18. Changes in the internal reflection of the transmission medium 14 cause changes the amount of light that propagates through the transmission medium 14 and reaches the optical detector 16. Accordingly, the electrical signal generated based on the light beam received by the optical detector 16 may be analyzed to determine if the internal reflection has changed.

Figure 2:
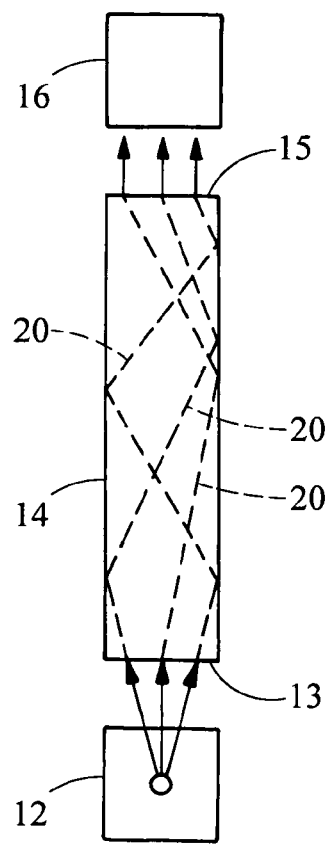
FIG. 2 is a side view of an optical control illustrating a light path in an unactivated state in accordance with the present invention.
Figure 3:
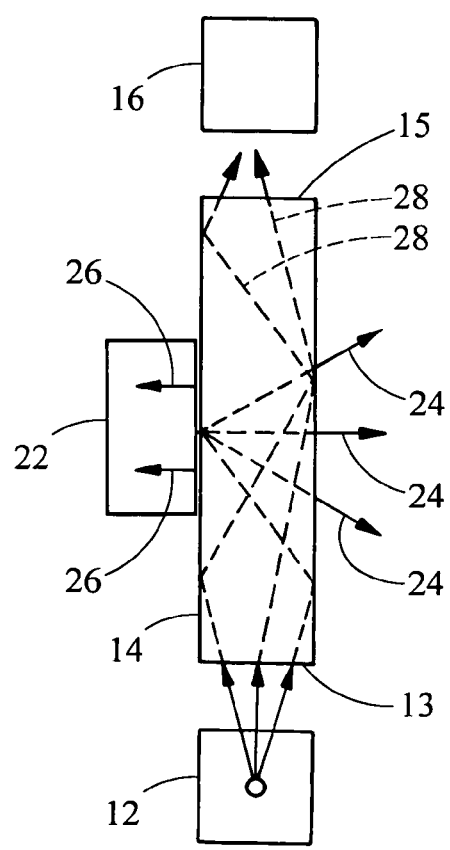
FIG. 3 is a side view of an optical control illustrating the light path when the control is activated in accordance with the present invention.

Now referring to FIGS. 2 and 3, an example is provided in more detail illustrating the changes in internal reflection when an object 22 comes in contact with the transmission medium 14. The optical source 12 generates a beam of light, as previously described above. The beam of light is received by the first end 13 of the transmission medium 14. With no object contacting the transmission medium 14, the entire beam of light propagates through the transmission medium 14 with minimal losses. In FIG. 2, the path of the beam of light within the medium is illustrated by the ray traces 20. As shown by the ray traces 20, the beam of light reflects off the internal walls of the transmission medium 14 as it propagates between the first end 13 of the transmission medium 14 to the second end 15 of the transmission medium 14, where it is received by the optical detector 16.

In FIG. 3, the optical source 12 provides the beam of light to the transmission medium 14 in the same manner as described above in reference to FIG. 1. However, only some of the traces 28 propagate the entire length of the transmission medium 14 and are provided to the optical detector 16. Some of the traces 24 are directed at an area of the transmission medium 14 where an object 22 is in contact with the wall of the transmission medium 14. When an object 22 is in contact with the transmission medium 14, the light that is directed at the contacted area will be absorbed or diffusely reflected. Light that is absorbed by the object 22 is indicated by ray traces 26. Light that is diffusely reflected into the transmission medium 14 is denoted by ray traces 24. Accordingly, when the angle of incidence with the side of the transmission medium 14 of the traces 24 is greater than the reflection angle of the transmission medium 14, the light will escape from the transmission medium 14 and be lost to the environment. With a smaller amount of light reaching the detector 16, the optical detector 16 will create an electrical signal indicative of that overall lower light power.

Figure 5:
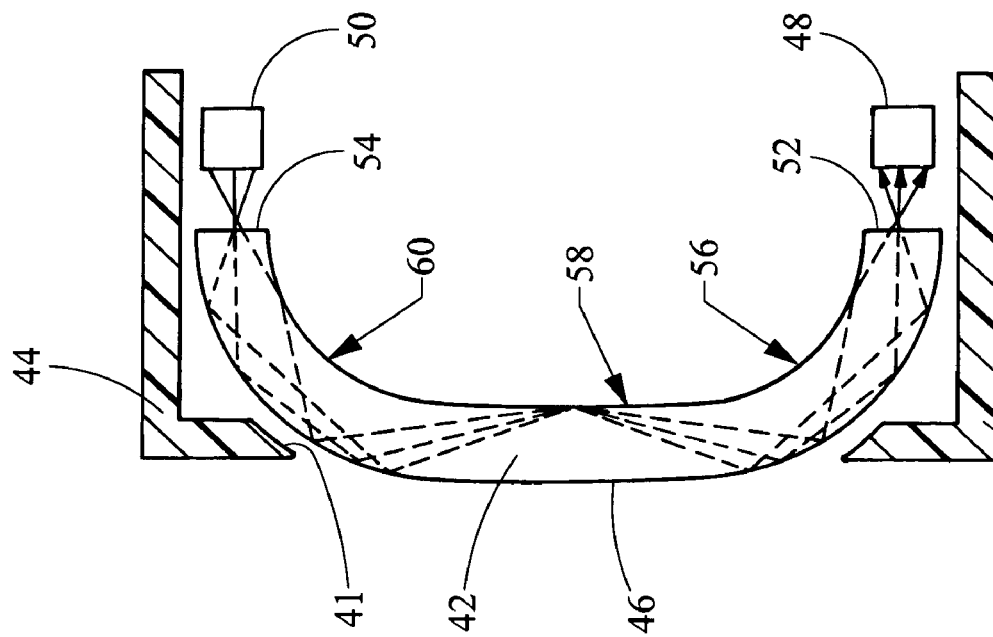
FIG. 5 is a sectional view, generally taken along line 5—5 in FIG. 4, of an optical control switch in accordance with the present invention.
Figure 4:
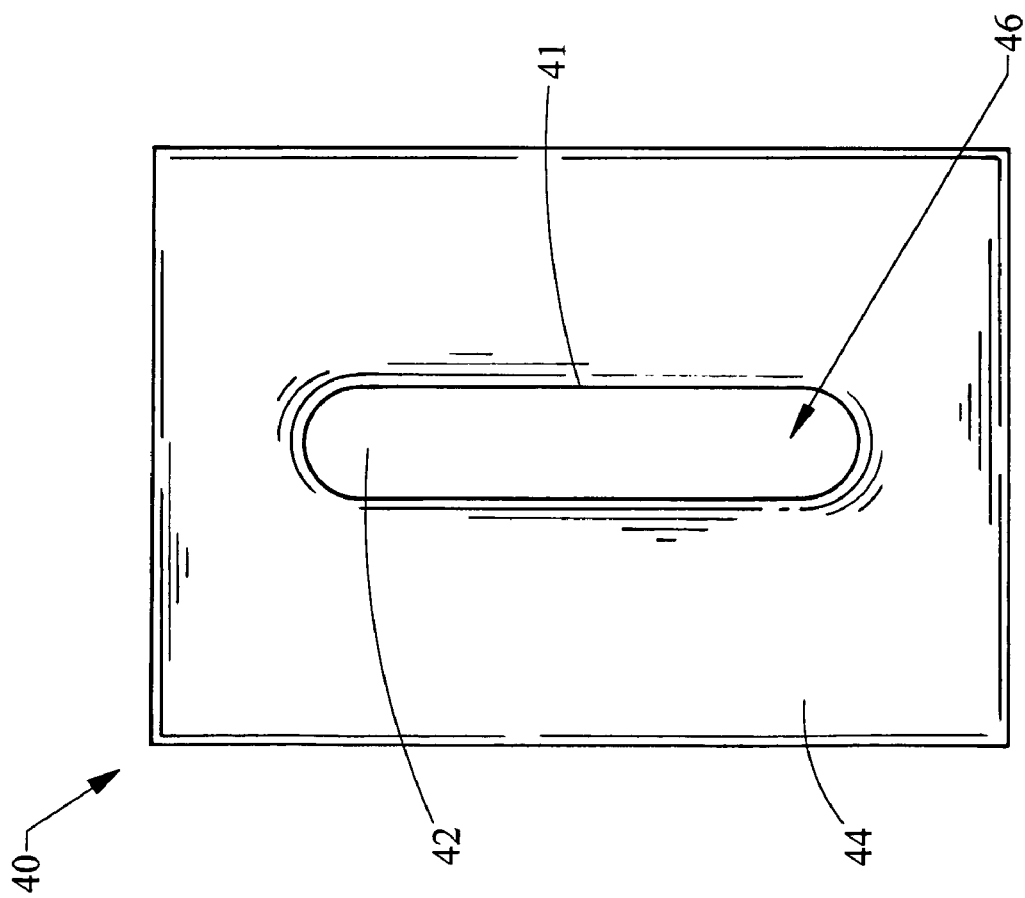
FIG. 4 is a front view of a optical control switch in accordance with the present invention.

Now referring to FIGS. 4 and 5, an optical switch 40 incorporating the above optical control 10 is provided. The optical switch 40 includes an optical source 48, a transmission medium 42, and an optical detector 50. As previously described, the optical source 48 generates a light beam that propagates through the transmission medium 42 and is received by the optical detector 50. To provide improved aesthetics, the optical switch 40 includes a housing 44 that may be made of a metal or plastic to match the environment, such as a vehicle interior, where the switch 40 is located. The housing 44 includes an opening 41 allowing a surface 46 of the transmission medium 42 to be exposed to the touch of the user through the opening 41. Accordingly, the transmission medium 42, is preferably provided with a geometry allowing the optical source and optical detector to be located out of plane with the touch surface 46 of the transmission medium 42. The optical source 48 is aligned with a first surface 52 of the transmission medium 42 and may, preferably, be configured to generate a beam of light that is transmitted substantially perpendicular to the surface 52.

The beam of light initially propagates along the transmission medium 42 to a curved portion 56 that changes the direction of light propagation. For the optical switch 40 the curved portion 56 provides approximately a 90° bend, although other geometries may be used. The curved portion 56 is in communication with a middle portion 58 that may be substantially straight or may include a slight curvature. The overall direction of propagation of the light beam through the middle portion 58 is generally in a direction that is parallel to an outside surface of the housing 44. This middle portion 58 includes the previously mentioned touch surface 46 that is exposed through the opening 41 and the housing 44. The light propagates along the middle portion 58 to a second curved portion 60. The second curved portion 60 provides a curve of about 90°, away from the front surface of the housing 44, allowing the light to propagate substantially perpendicular to the direction of propagation in the middle portion 58. The light propagates from the second curved portion 60 through a second surface 54 that is aligned with the optical detector 50, such that the beam of light may be received by the optical detector 50 which will generate an electrical signal. The electrical signal is indicative of the power of the optical beam and any change in the internal reflection characteristics of the transmission medium 42.

As shown and described above, the transmission medium 42 generally has a "C" shape where the first surface 52 that receives the light beam is substantially parallel to the second surface 54 that is aligned with the optical detector 50 to provide the light beam to the optical detector 50. The geometry of the transmission medium 42 allows improved packaging options including compact location of the optical source 48, the optical detector 50, and any processing electronics. In addition, the geometry of the transmission medium 42 may provide for the reduced effect of ambient light on the optical detector 50 resulting in improved sensing of changes in the internal reflection characteristics of the transmission medium 42. Obviously, however, other configurations can be employed depending on design criteria and packaging.

When using the optical switch 40, the user may direct an object, such as a finger, to contact the touch surface 46 of the transmission medium 42, thereby changing the internal reflection characteristics of the transmission medium 42. The optical detector 50 senses the lower power of the light beam (resulting from the change in internal reflection) and changes the state of the optical switch 40.

Figure 6:
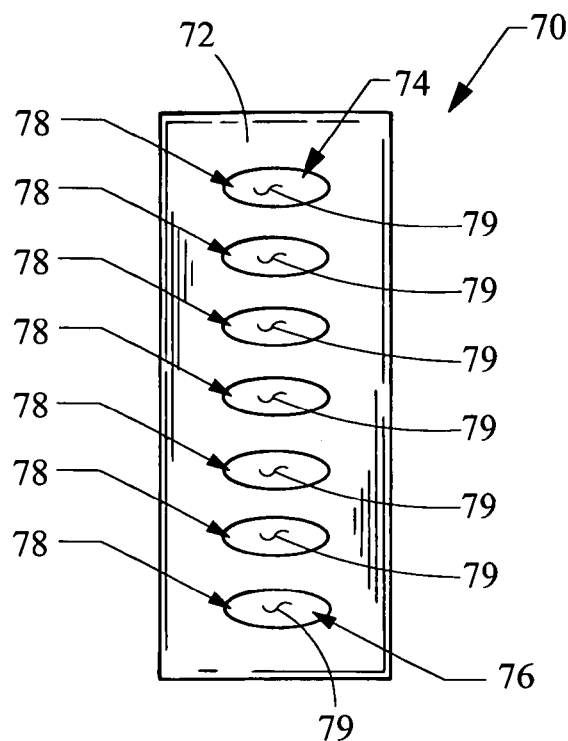
FIG. 6 is a slide-type control based on an optical control switch in accordance with the present invention.
Figure 7:
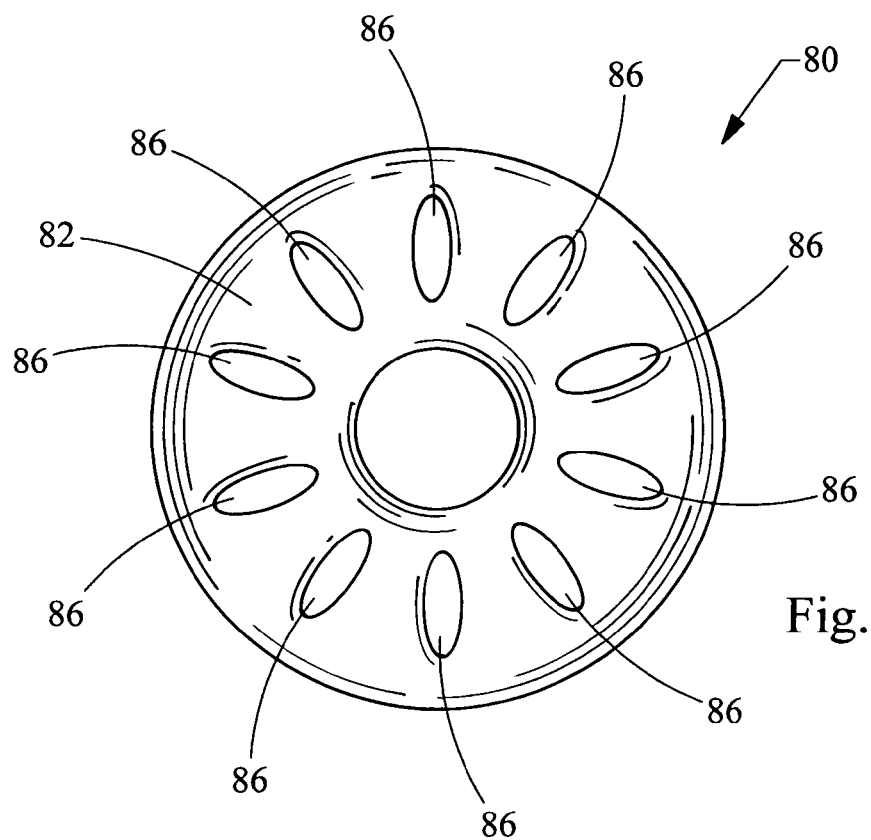
FIG. 7 is a dial-type control based on an optical control switch in accordance with the present invention.

Now referring to FIG. 6, various optical controls may be configured using multiple optical switches 40 of the type described above. In one embodiment, an optical slide-type control 70 is configured from a plurality of optical switches 78. Provided in a linear arrangement, a series of touch surfaces 79, one touch surface 79 for each optical switch 40, is exposed through a corresponding opening in the a housing 72. As described in reference to optical switch 40, each optical switch 78 is configured to sense a change in internal reflection when the user contacts the touch surface 79 of one of the optical switches 78. Accordingly, the user may touch one of the switches 78, indicating a level or setting of the slide-type control 70 based on the location of the optical switch the order from the top control 74 to the bottom control 76. Alternatively, the slide-type control 70 may be oriented in a horizontal direction where the order or level may be determined from left to right across the slide-control control 70.

In another embodiment, a dial-type control 80 is constructed from a plurality of optical switches 86 configured in a circular arrangement. Each of the optical switches 86 has a touch surface exposed through a housing 82 and is configured to sense a change in internal reflection when the user contacts the surface of one of the optical switches 86. Accordingly, the user may touch one of the switches indicating a level or setting of the dial control 80 based on the radial location of the optical switch. In addition, a controller can determine the transition between switches as the user moves from adjacent switch to adjacent switch around the dial control 80. The transition between multiple switches may be interpreted by the controller as an adjustment to the level of a user setting. For example, a clockwise transition can be used to provide an increase in the user settings and a counterclockwise transition can be used to provide a decrease the level of the user setting.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

I claim:

1. An optical control for an HMI of a vehicle, the optical control comprising:
    an optical source configured to generate a light beam;
    a waveguide optically coupled to the optical source and configured to propagate the light beam therethrough, the waveguide including a touch surface;
    a detector optically coupled to the waveguide, wherein the detector is configured to sense changes in the internal reflection of the waveguide when an object contacts the waveguide on the touch surface.

2. The optical control according to claim 1, wherein the first surface is at a first end of the waveguide and the second surface is in an opposite second end of the waveguide.

3. The optical control according to claim 2, wherein the first and second surfaces are generally parallel to one another.

4. The optical control according to claim 3, wherein the touch surface is substantially parallel to the first and second surface.

5. The optical control according to claim 4, wherein the light beam is configured to travel from the first surface through a first bent portion of the waveguide, then through a middle portion of the waveguide to a second bent portion and then to the second surface.

6. The optical control according to claim 5, wherein the touch surface is located on the middle portion of the waveguide.

7. The optical control according to claim 6, wherein the middle portion is generally straight.

8. The optical control according to claim 7, wherein the waveguide is generally C-shaped.

9. The optical control according to claim 8, wherein the optical source waveguide and detector define a switch element, and further comprising a controller electrically coupled to the optical source and the detector.

10. The optical control according to claim 9, wherein the optical switch element is one of a plurality of similar optical switch elements, each switch element being in electrical communication with a controller to provide a switch output.

11. The optical control according to claim 10, wherein all of the switch elements are in electrical communication with a common controller.

12. The optical control according to claim 11, wherein the controller is configured to generate a value based on the change of internal reflection in at least one of the optical switch elements and the location of the at least one of each of the similar optical switch elements in the plurality of similar optical switch elements.

13. The optical control according to claim 12, wherein the switch elements of the plurality of similar optical switch elements are provided in a linear arrangement.

14. The optical control according to claim 12, wherein the switch elements of the plurality of similar optical switch elements are provided in an annular arrangement.

15. The optical control according to claim 1, further comprising a housing wherein the housing includes portions defining an opening, and the touch surface being exposed through the opening.

16. The optical control according to claim 1, wherein the waveguide includes a first surface aligned with the optical source and configured to receive the light beam, the waveguide also including a second surface aligned with the detector and configured to provide the light beam to the detector.

* * * * *